United States Patent
Mada

(10) Patent No.: US 8,019,027 B2
(45) Date of Patent: Sep. 13, 2011

(54) DIGITAL BROADCASTING RECEIVER

(75) Inventor: Kenichi Mada, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 826 days.

(21) Appl. No.: 11/870,477

(22) Filed: Oct. 11, 2007

(65) Prior Publication Data

US 2008/0152051 A1    Jun. 26, 2008

(30) Foreign Application Priority Data

Dec. 22, 2006  (JP) ................................. 2006-345226

(51) Int. Cl.
*H04L 27/08* (2006.01)

(52) U.S. Cl. ..... 375/345; 375/316; 375/340; 455/232.1; 455/234.1

(58) Field of Classification Search ................ 375/316, 375/340, 345; 455/232.1, 234.1
See application file for complete search history.

(56) References Cited

U.S. PATENT DOCUMENTS

| | | | | |
|---|---|---|---|---|
| 2005/0123083 A1* | 6/2005 | Kawakami | ...... | 375/347 |
| 2005/0181755 A1* | 8/2005 | Hoshino et al. | ...... | 455/272 |
| 2006/0158376 A1* | 7/2006 | Kaneko | ...... | 342/464 |
| 2009/0079881 A1* | 3/2009 | White et al. | ...... | 348/731 |

FOREIGN PATENT DOCUMENTS

| | | |
|---|---|---|
| JP | 08116497 | 5/1996 |
| JP | 11289499 A * | 10/1999 |
| JP | 2007-282036 | 10/2007 |

OTHER PUBLICATIONS

Japanese Office Action dated Apr. 26, 2011.

* cited by examiner

*Primary Examiner* — Leon Flores
(74) *Attorney, Agent, or Firm* — Pillsbury Winthrop Shaw Pittman, LLP

(57) ABSTRACT

A digital broadcasting receiver includes: a variable gain amplifier for amplifying an electric wave received through an antenna, a gain of the variable gain amplifier being made variable in accordance with a signal from the outside; a distributor for distributing the signal from the variable gain amplifier into two signals; first and second tuners connected to the distributor for performing selection of broadcastings, and amplification; digital demodulation ICs for demodulating output signals from the first and second tuners, thereby obtaining digital signals, respectively; and a signal processing portion for processing the digital signals from the digital demodulation ICs. The signal processing portion calculates bit error rates of the first and second tuners, and when at least one of the bit error rates is equal to or larger than a threshold, varies the gain of the variable gain amplifier.

5 Claims, 3 Drawing Sheets

DIGITAL BROADCASTING RECEIVER

The present application is based on Japanese patent application No. 2006-345226, the entire contents of which are incorporated herein by reference.

BACKGROUND

1. Field

One embodiment of the invention relates to a digital broadcasting receiver which is capable of simultaneously displaying received images of a plurality of broadcasting programs on one display device, and recording any one of data on the received images.

2. Description of the Related Art

In recent years, a television receiver which simultaneously displays two television broadcastings in the form of a main picture and a sub picture on one display device has been put to practical use. This sort of television receiver has two tuners built therein in order to simultaneously display a main picture and a sub picture on one display device. In this case, one tuner is used for the main picture, and the other is used for the sub picture. For display of the main picture and the sub picture, there are display modes such as a picture-in-picture mode, a picture-by-picture mode, and a dual window mode in which two pictures are displayed on a left-hand side and a right-hand side of a screen of a display device, respectively. In addition, only one main picture can be displayed.

In a reception system using two tuners, a distributor distributes a signal received through one antenna into two signals, and the resulting two signals are inputted to the two tuners, respectively. However, the insertion of the distributor results in that antenna terminal voltages of the two tuners, that is, leakage voltages of a local oscillator interfere with each other, thereby degrading an image quality. In order to solve this problem, an amplifier for mutual isolation between the two tuners is provided between the distributor and the antenna. This technique, for example, is disclosed in the Japanese Patent Kokai No. 8-116497.

On the other hand, for start of a ground wave digital broadcasting, the development of a digital broadcasting receiver is in progress now. In the case of the digital broadcasting receiver, a noise factor (NF) from an antenna input to a digital modulation IC is dominant in reception sensitivity performance. Since an insertion loss (for example, 4 dB) of the distributor occurs when the distributor is inserted in the manner as has been described, the NF becomes worse, so that sensitivity of reception of a weak electric field becomes worse. Although the amplifier is provided in the preceding stage of the distributor in order to solve this problem, conversely, the amplifier generates a distortion due to input of a signal having a strong electric field, which results in the quality of received signal being degraded. In order to prevent this situation, the gain of the amplifier is set in consideration of a balance between the sensitivity for the weak electric field and the performance for the distortion caused by the strong electric field.

However, in the conventional digital broadcasting receiver, even when the gain of the amplifier is set in consideration of the balance between the sensitivity for the weak electric field and the performance for the distortion caused by the strong electric field, both the weak electric field and the strong electric field cannot be optimized in some cases. Therefore, it is difficult to receive the electric wave in the best state for any of the received signal having the weak electric field and the received signal having the strong electric field. In particular, in the digital broadcasting, there are the characteristics that when the received signal becomes weak in level, a bit error abruptly increases upon reduction of the received signal to a certain level. For this reason, the setting of the gain of the amplifier connected to the antenna is very important.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION OF PREFERRED EMBODIMENTS

Figure 1:
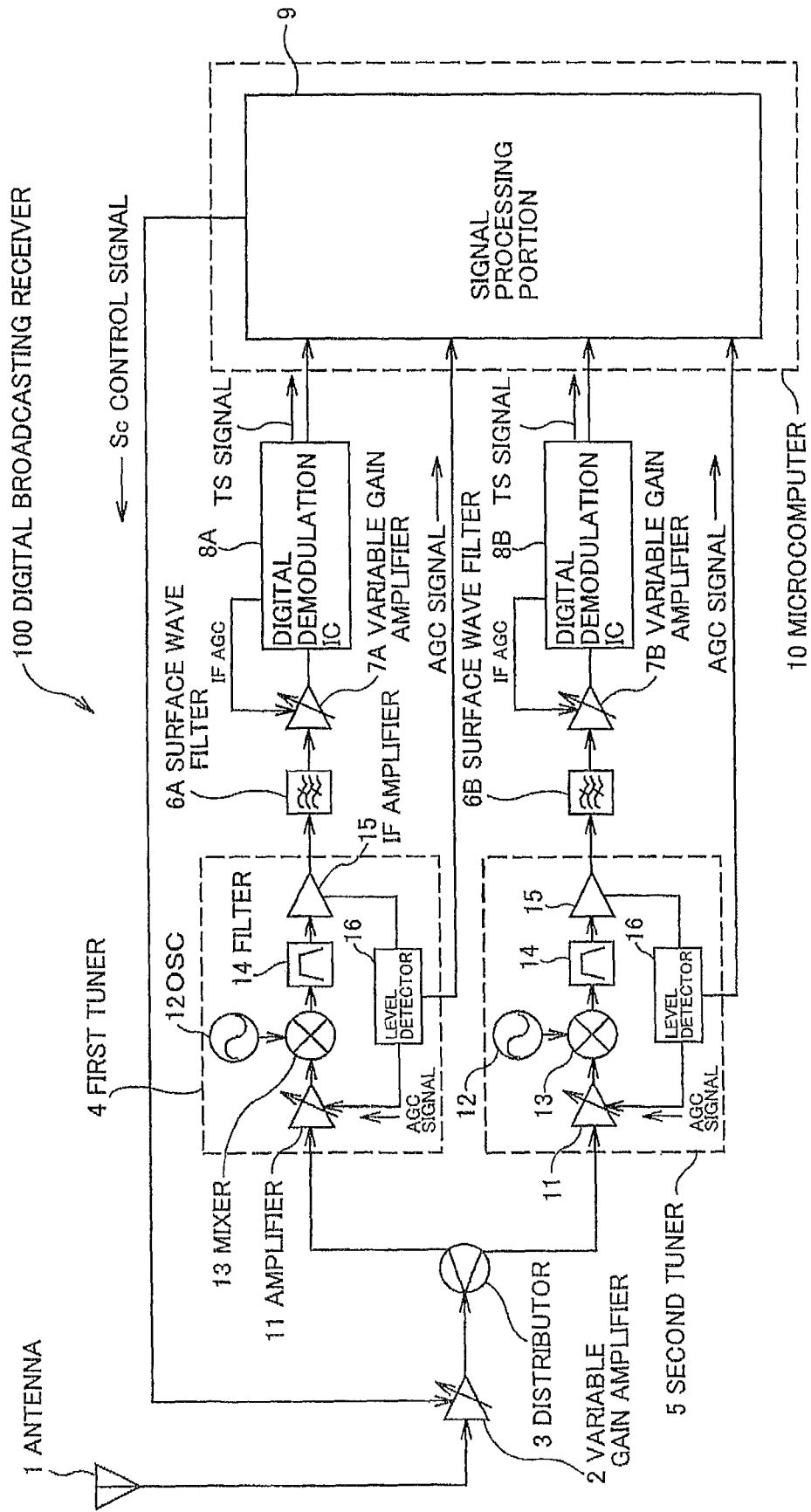
FIG. 1 is a circuit diagram showing a circuit structure of a digital broadcasting receiver according to an embodiment of the invention.

Various embodiments according to the invention will be described hereinafter with reference to the accompanying drawings. In general, according to one embodiment of the invention, there is provided a digital broadcasting receiver, including: a variable gain amplifier for amplifying an electric wave received through an antenna, a gain of the variable gain amplifier being variable; a plurality of tuners for performing selection of broadcastings, and amplification, each of the plurality of tuners being connected to the variable gain amplifier through a distributor; and a signal processing portion for judging degradation states of digital signals obtained by demodulating output signals from the plurality of tuners, and varying the gain of the variable gain amplifier in accordance with a judgment result.

According to the constitution as described above, even when the digital signals obtained by demodulating the output signal from one or all of the plurality of tuners is degraded, the gain of the variable gain amplifier is varied in accordance with the judgment result about the degradation states of the digital signals, which results in that the electric wave can be received in the best state.

In addition, according to one embodiment of the invention, there is provided a digital broadcasting receiver, including: a variable gain amplifier for amplifying an electric wave received through an antenna, a gain of the variable gain amplifier being variable; a plurality of tuners for performing selection of broadcastings, and amplification, each of the plurality of tuners being connected to the variable gain amplifier through a distributor; and a signal processing portion for judging degradation states of digital signals obtained by demodulating output signals from the plurality of tuners, and varying the gain of the variable gain amplifier in accordance with a judgment result so as to improve the degradation states of the digital signals obtained by demodulating the output signals from the plurality of tuners, respectively.

According to the constitution as described above, since the gain of the variable amplifier is varied so that the degradation states of the digital signals obtained by demodulating the output signals from the plurality of tuners, respectively, are improved in accordance with the results of the judgment about the degradation states of the digital signals, the electric wave can be received in the best state.

In addition, according to one embodiment of the invention, there is provided a digital broadcasting receiver, including: a variable gain amplifier for amplifying an electric wave received through an antenna, a gain of the variable gain amplifier being variable; a distributor for distributing a signal from the variable gain amplifier into a plurality of outputs; a first tuner for performing selection of a broadcasting, and amplification for one distribution output from the distributor; a second tuner for performing selection of a broadcasting, and amplification for another distribution output from the distributor; first and second demodulating portions for demodulating output signals from the first and second tuners, thereby obtaining digital signals, respectively; and a signal processing portion for calculating bit error rates of the first and second tuners for the digital signals from the first and second demodulating portions, respectively, and varying the gain of the variable gain amplifier when at least one of the bit error rates is equal to or larger than a threshold.

According to the constitution as described above, since the gain of the variable gain amplifier is varied when at least one of the bit error rates for the digital signals obtained by demodulating the output signals from the first and second tuners is equal to or larger than the threshold, the electric wave can be received in the best state.

According to the digital broadcasting receiver of the invention, the electric wave can be received in the best state for any of the received signal having the weak electric field and the received signal having the strong electric field.

[Structure of Digital Broadcasting Receiver]

FIG. 1 shows a digital broadcasting receiver according to an embodiment of the invention. The digital broadcasting receiver 100 includes a variable gain amplifier 2 for amplifying a radio frequency (RF) signal received through an antenna 1, a distributor 3 for distributing an amplified RF output signal from the variable gain amplifier 2 into two RF output signals, first and second tuners 4 and 5 which are connected to two distribution outputs of the distributor 3, respectively, surface wave filters 6A and 6B for band-limiting frequencies of output signals from the first and second tuners 4 and 5, respectively, variable gain amplifiers 7A and 7B for amplifying output signals from the surface wave filters 6A and 6B, respectively, digital demodulation ICs (demodulating portions) 8A and 8B for demodulating output signals from the variable gain amplifiers 7A and 7B, and outputting transport stream (TS) signals, respectively, and a microcomputer 10 including a signal processing portion 9 for processing the TS signals from the digital demodulation ICs 8A and 8B, and an audio visual (AD) detector (not shown).

In addition, the digital broadcasting receiver 100 includes a display device, a digital image processing circuit for displaying an image on the display device, an audio amplifying circuit, a speaker which is driven by the audio amplifying circuit, a power source portion for supplying a suitable voltage to each of the circuits, and the like. Here, illustration of these portions is omitted in FIG. 1.

The variable gain amplifier 2 is structured so that its gain can be varied in accordance with a control signal $S_c$ outputted from the signal processing portion 9.

The distributor 3 is of a one-input two output type, and has the same impedance as that of each of the antenna 1, and the first and second tuners 4 and 5. Here, the distributor 3 may have three or more distributor outputs.

Since the first and second tuners 4 and 5 have the same circuit structure and the same specification, the circuit structure of the first tuner 4 will now be described herein. The first tuner 4 includes an amplifier 11 for amplifying the RF signal from the distributor 3, a local oscillator (OSC) 12 for generating a signal having an intermediate frequency (IF), a mixer 13 for outputting a signal having a frequency corresponding to a difference between the output frequency of the RF signal from the amplifier 11 and the output frequency of the signal from the local oscillator 12, a filter 14 for passing only a signal component having a necessary band of the signal, having the intermediate frequency, outputted from the mixer 13, an IF amplifier 15 for amplifying an output signal from the filter 14, and a level detector 16 for generating an automatic gain control (AGC) signal (AGC signal) in correspondence to a level of an output from the IF amplifier 15, and supplying the resulting RF AGC signal to each of the amplifier 11 and the signal processing portion 9.

The surface wave filters 6A and 6B have the same structure and the same specification. A surface acoustic wave device which, for example, is made of $LiNbO_3$ as a basic constituent can be used in each of the surface wave filters 6A and 6B.

The variable gain amplifiers 7A and 7B have the same structure and the same specification, and thus the gains of the variable gain amplifiers 7A and 7B can be varied in correspondence to the AGC signals (IF AGC signals) from the digital demodulation ICs 8A and 8B, respectively.

The digital demodulation ICs 8A and 8B have the same constitution and the same specification. Each of the digital demodulation ICs 8A and 8B includes an A/D converter, an orthogonal frequency division multiplexing (OFDM) demodulator, and the like.

The signal processing portion 9 TS-decodes the TS signals from the digital demodulation ICs 8A and 8B, calculates bit error rates for the TS signals thus TS-decoded, and controls the gain of the variable gain amplifier 2 in accordance with the calculation results. Also, the signal processing portion 9 outputs signals which are obtained by subjecting the TS signals to error correction to an AV decoder provided in the microcomputer 10.

The microcomputer 10 includes a CPU, a ROM, a RAM, a video memory, an interface circuit, and the like which are all not shown in FIG. 1, and controls the signal processing portion 9 and the entire digital broadcasting receiver 100.

[Operation of Digital Broadcasting Receiver 100]

Next, an operation of the digital broadcasting receiver 100 will now be described in detail. While the power source is held in an ON state, the digital broadcasting receiver 100 receives one or two broadcastings of one or two channels which a user selects, and thus one or two broadcastings are displayed on a display device (not shown) such as a liquid crystal display device or a plasma display device in a specified display mode (such as a picture-in-picture mode, a picture-by-picture mode, or a dual window mode).

In this embodiment, it is assumed that the first and second tuners 4 and 5 simultaneously receive the broadcastings of different channels, respectively, and the microcomputer 10 displays an image the RF signal on which is obtained through the first tuner 4 in the form of a main picture, and also displays an image the RF signal on which is obtained through the second tuner 5 in the form of a sub picture.

Here, normally, the two tuners are equally managed and are not fixed in operation in many cases because there are many limits when the two tuners are fixed in operation for pictures such as a main picture (for recording) and a sub picture (for a broadcasting to compete with a popular program). A description will be given hereinafter with respect to the case where the tuner having primary over the other is not fixed in operation, but the tuner having primary over the other can be changed by selection made at that time by the user.

After the RF signal received through the antenna 1 is amplified by the variable gain amplifier 2 which is operating at an amplification degree set by the signal processing portion 9, the resulting RF output signal is distributed into the two RF output signals by the distributor 3, and the resulting two RF output signals are inputted to the first and second tuners 4 and 5, respectively.

In the first tuner 4, after the amplifier 11 amplifies the received RF output signal, the OSC 12 and the mixer 13 perform the tuning and the frequency conversion for the resulting RF output signal, the resulting IF output signal is inputted to the IF amplifier 15 through the IF filter 14, and the IF amplifier 15 then performs the intermediate frequency amplification for the IF output signal thus inputted thereto. The output signal from the IF amplifier 15 is outputted to each of the surface wave filter 6A and the level detector 16. Also, the level detector 16 generates an AGC signal which is used to control the amplifier 11 in accordance with a level of a signal detected by the level detector 16. The amplifier 11 operates so as to reduce the sensitivity for the strong received signal in accordance with the AGC signal from the level detector 16 and so as to increase the sensitivity for the weak received signal in accordance with the AGC signal from the level detector 16. In the second tuner 5 as well, the constituent elements thereof operate similarly to those of the first tuner 4.

After the IF signals from the first and second tuners 4 and 5 are band-limited by the surface wave filters 6A and 6B, respectively, the resulting signals are amplified by the variable gain amplifiers 7A and 7B, respectively. At this time, the variable gain amplifiers 7A and 7B operate so as to obtain the uniform amplification degrees in accordance with the IF AGC signals from the digital demodulation ICs 8A and 8B, respectively.

The digital demodulation ICs 8A and 8B demodulates the signals from the variable gain amplifiers 7A and 7B through the A/D conversion to generate demodulated signals (TS signals), respectively, and send the resulting demodulated signals to the signal processing portion 9.

The signal processing portion 9 acquires information such as bit error rates and signal levels for the TS signals from the digital demodulation ICs 8A and 8B. The signal processing portion 9 checks to see if the digital broadcasting receiver 100 can receive the signal in a satisfactory state in accordance with the bit error rates, and when at least one of the bit error rates of the first and second tuners 4 and 5 is equal to or larger than a preset threshold, outputs a control signal $S_c$ to the variable gain amplifier 2, thereby controlling the variable gain amplifier 2 so that the at least one of the bit error rates of the first and second tuners 4 and 5 becomes best.

[Control for Variable Gain Amplifier 2]

Figure 2:
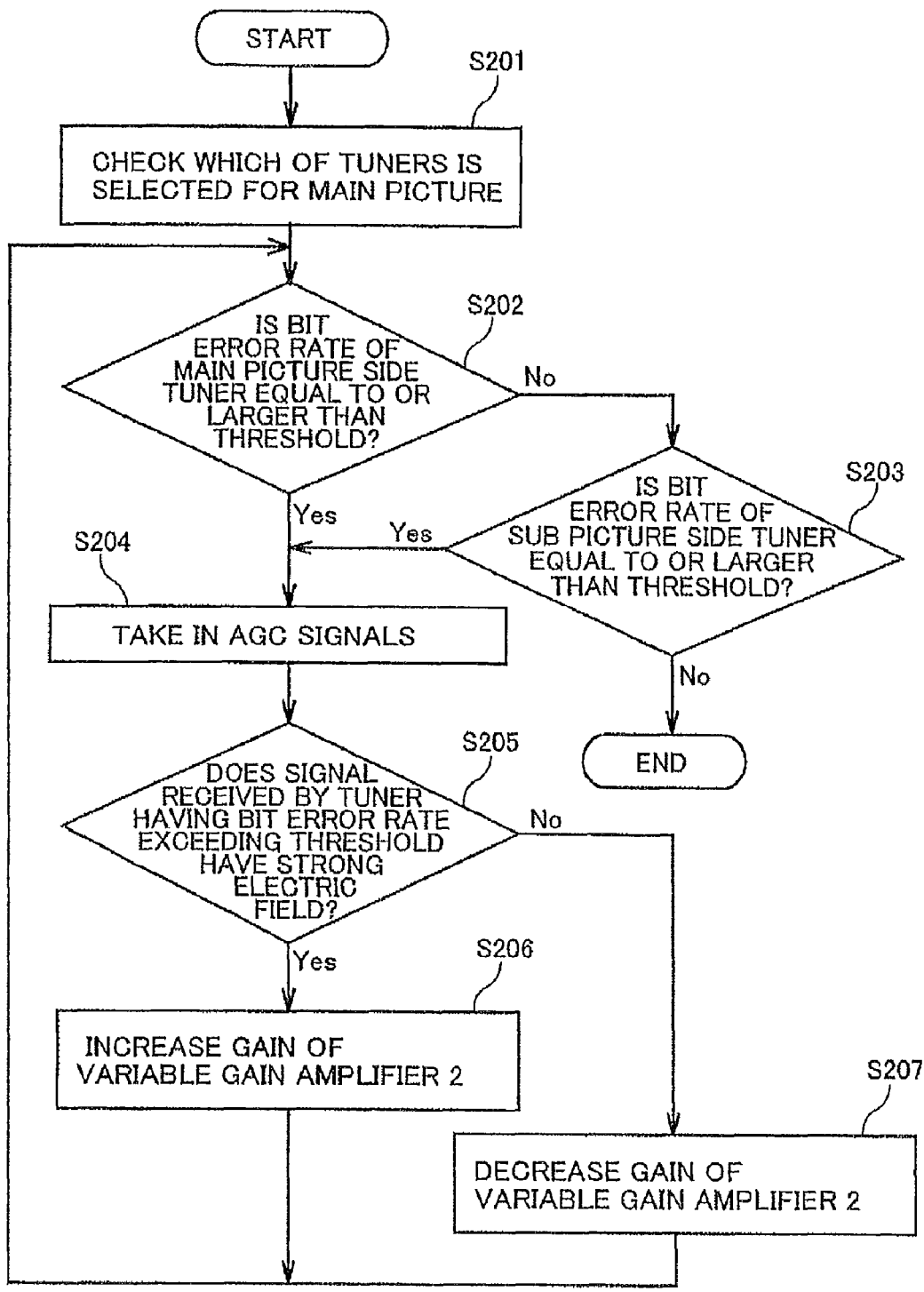
FIG. 2 is a flow chart showing an operation for gain variable control for a variable gain amplifier.

FIG. 2 shows an operation for variable gain control for the variable gain amplifier 2. The operation shown in FIG. 2 is performed every lapse of a given period of time, or at a timing of the channel selection or the like.

Firstly, it is checked which of the first and second tuners 4 and 5 is selected for the main picture (Step S201). Next, it is judged whether or not the bit error rate of the main picture side tuner (for example, the first tuner 4) exceeds a threshold which is set in a phase of manufacture (step S202). When it is judged that the bit error rate of the main picture side tuner (the first tuner 4) does not exceed the threshold (Step S202: No), it is judged whether or not the bit error rate of the sub picture side tuner (for example, the second tuner 5) exceeds the threshold which is set in the phase of the manufacture (step S203). When it is judged that the bit error rate of the sub picture side tuner (the second tuner 5) does not exceed the threshold (step S203: No), the operation for the gain variable control is completed.

On the other hand, when it is judged in Step S202 that the bit error rate of the first tuner 4 is equal to or larger than the threshold (step S202: Yes), or when the result about the judgment in Step S202 is No and the result about the judgment in Step S203 is Yes, the signal processing portion 9 takes therein the AGC signals from the level detectors 16 of the first and second tuners 4 and 5 (Step S204), and it is judged whether the signal received by the tuner having the bit error rate exceeding the threshold has a weak electric field or a strong electric field (Step S205). When the signal concerned has the strong electric field (Step S205: Yes), the signal processing portion 9 sends the control signal $S_c$ to the variable gain amplifier 2, so that the variable gain amplifier 2 is controlled so as to increase its gain (Step S206). On the other hand, when the signal concerned has the weak electric field (Step S205: No), the signal processing portion 9 sends the control signal $S_c$ to the variable gain amplifier 2, so that the variable gain amplifier 2 is controlled so as to reduce its gain (Step S207).

Figure 3A:
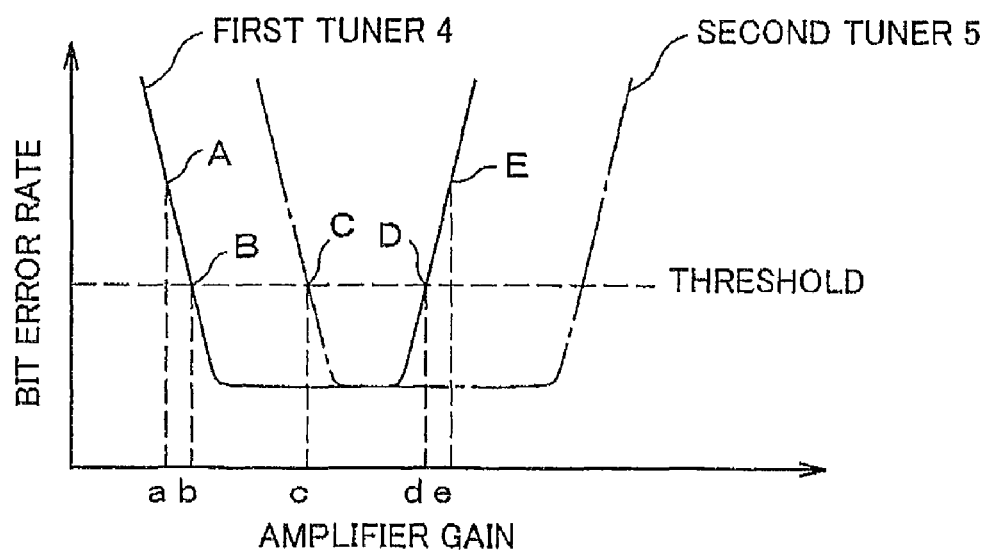
FIG. 3A is a characteristic diagram explaining the case where signal strengths of signals received by first and second tuners, respectively, are closed to each other in a relationship between a bit error rate and an amplifier gain.
Figure 3B:
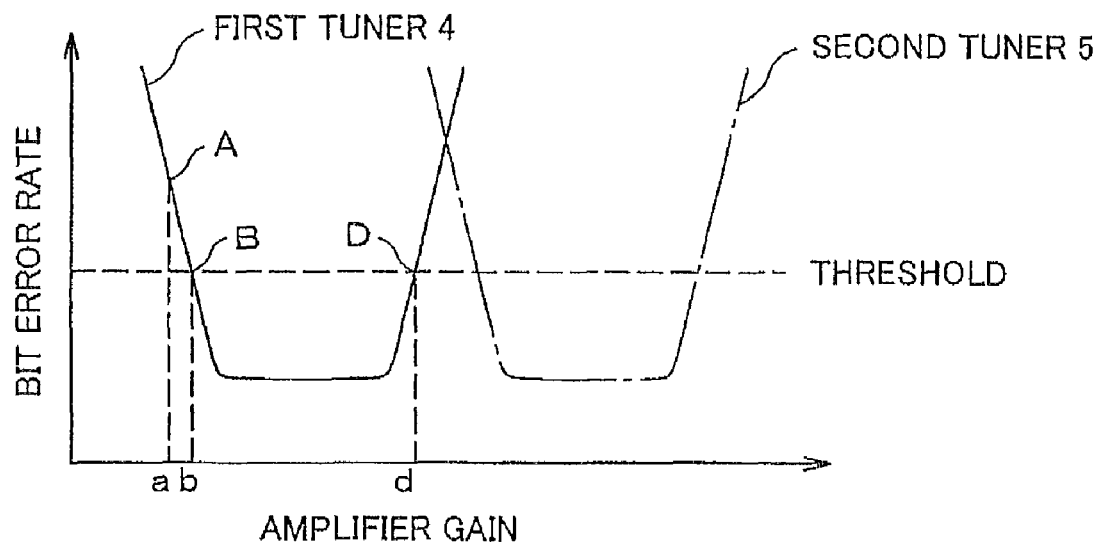
FIG. 3B is a characteristic diagram explaining the case where the signal strengths of the signals received by the first and second tuners, respectively, are away from each other in the relationship between the bit error rate and the amplifier gain.

FIGS. 3A and 3B show a relationship between the bit error rates of the first and second tuners 4 and 5, and the amplifier gain of the variable gain amplifier 2. That is to say, FIG. 3A shows the case where the signal strengths of the signals received by the first and second tuners 4 and 5, respectively, are close to each other, and FIG. 3B shows the case where the signal strengths of the signals received by the first and second tuners 4 and 5, respectively, are away from each other. Also, both FIGS. 3A and 3B show the case where the signal strength is higher in the main picture side tuner than in the sub picture side tuner.

Referring now to FIG. 3A, when the bit error rate of the first tuner 4 is equal to or larger than the threshold (Step S202: Yes), for example, it is expected that the bit error rate acquired by the signal processing portion 9 is located at a point A or E. Also, when the signal received by the first tuner 4 is judged to have the strong electric field in accordance with the AGC signal (Step S205: Yes), the bit error rate concerned is decided as being located at the point A. As a result, the signal processing portion 9 controls the amplifier gain of the variable gain amplifier 2 so that the amplifier gain concerned passes through the point b corresponding to the bit error rate at the point B so as to become equal to or smaller than the threshold. At this time, the signal processing portion 9 controls the amplifier gain of the variable gain amplifier 2 so that the bit error rate of the second tuner 5 also becomes equal to or smaller than the threshold, that is, the amplifier gain concerned falls within the range between a point c and a point d corresponding to the range of the bit error rate between a point C and a point D in which the amplifier gain characteristics of the first and second tuners 4 and 5 overlap each other. By performing the control for the amplifier gain of the variable gain amplifier 2 in the manner as described above, each of the bit error rates of the first and second tuners 4 and 5 becomes smaller than the threshold.

On the other hand, when the bit error rate of the first tuner 4 is at the same level as that at the point A, and the bit error rate acquired by the signal processing portion 9 is located at the point E and the amplifier gain at that time is at a point e, the signal processing portion 9 reduces the amplifier gain of the variable gain amplifier 2 until the amplifier gain reaches the point d corresponding to the point D at which the bit error rate falls within the threshold value.

In addition, referring now to FIG. 3B, for example, when the bit error rate of the first tuner 4 acquired by the signal processing portion 9 is located at the point A, the signal processing portion 9 increases the amplifier gain of the variable gain amplifier 2 until the amplifier gain reaches the point d corresponding to the point D at which the gain characteristics of the first tuner 4 is closest to those of the second tuner 5, and thus the bit error rate of the first tuner 4 becomes equal to or smaller than the threshold.

Note that, when the signal inputted to the first tuner 4 is judged to have the weak electric field, that is, when the gain characteristics of the first tuner 4 are replaced with those of the second tuner 5 in FIG. 3A, the processing in Step S207 (refer to FIG. 2) is executed similarly to the case where the signal inputted to the first tuner 4 is judged to have the strong electric field. For example, when the bit error rate of the second tuner 5 is located at the point A, the signal processing portion 9 outputs the control signal $S_c$ to the variable gain amplifier 2 so that the amplifier gain of the variable gain amplifier 2 falls within the range between the point c and the point d in which each of the bit error rates of the first and second tuners 4 and 5 is equal to or smaller than the threshold.

According to the above-mentioned embodiment of the invention, the following effects can be offered:

(1) Since the signal processing portion 9 monitors the bit error rates of the first and second tuners 4 and 5, and makes the gain of the variable gain amplifier 2 variable so that both the bit error rates become best, the digital broadcasting electric wave can be received in the best state in any of the received signal having the weak electric field and the received signal having the strong electric field.

(2) Since the bit error rate can be made smaller than the threshold by increasing the gain of the variable gain amplifier 2, it is possible to improve the situation that the received electric wave becomes weak to increase the bit error rate.

It should be noted that the invention is not intended to be limited to the above-mentioned embodiment, and the various kinds of changes thereof can be made by those skilled in the art without departing from the gist of the invention.

For example, although the case where the two tuners are provided has been described so far in the above-mentioned embodiment, three or more tuners may also be provided. In this case, a distributor having three or more distribution outputs must be used.

In addition, although the degradation states of the digital signals obtained by demodulating the output signals from the two tuners are judged in accordance with the bit error rates, respectively, any other suitable method using data error rates or the like instead of using the bit error rates may also be adopted.

What is claimed is:

1. A digital broadcasting receiver comprising:
a variable gain amplifier for amplifying an electric wave received through an antenna, a gain of the variable gain amplifier being variable;
a plurality of tuners for performing selection of broadcastings, and amplification, each of the plurality of tuners being connected to the variable gain amplifier through a distributor; and
a signal processing portion for judging degradation states of digital signals obtained by demodulating output signals from the plurality of tuners, and varying the gain of the variable gain amplifier in accordance with a judgment result so as to improve the degradation states of the digital signals obtained by demodulating the output signals from the plurality of tuners, respectively, wherein one of the plurality of tuners corresponds to a main picture, and another of the plurality of tuners corresponds to a sub picture, and
when a value representing the degradation state of the digital signal obtained by demodulating the output signal from the one tuner corresponding to the main picture is smaller than a threshold, and a value representing the degradation state of the digital signal obtained by demodulating the output signal from the another tuner corresponding to the sub picture is equal to or larger than the threshold, the signal processing portion increases or decreases the gain of the variable gain amplifier so as to reduce the value representing the degradation state of the digital signal obtained by demodulating the output signal from the another tuner corresponding to the sub picture.

2. A digital broadcasting receiver according to claim 1, wherein the signal processing portion calculates bit error rates as the values representing the degradation states of the digital signals obtained by demodulating the output signals from the plurality of tuners, respectively.

3. A digital broadcasting receiver according to claim 1, wherein the signal processing portion judges the tuners belonging to the main picture and the sub picture, respectively, from the plurality of tuners in accordance with AGC signals from the plurality of tuners.

4. A digital broadcasting receiver comprising:
a variable gain amplifier for amplifying an electric wave received through an antenna, a gain of the variable gain amplifier being variable;
a distributor for distributing a signal from the variable gain amplifier into a plurality of outputs;
a first tuner for performing selection of broadcastings, and amplification for one distribution output from the distributor;
a second tuner for performing selection of broadcastings, and amplification for another distribution output from the distributor;
first and second demodulating portions for demodulating output signals from the first and second tuners, thereby obtaining digital signals, respectively; and
a signal processing portion for calculating bit error rates of the first and second tuners for the digital signals from the first and second demodulating portions, respectively, and varying the gain of the variable gain amplifier when at least one of the bit error rates is equal to or larger than a threshold, wherein one of the first and second tuners corresponds to a main picture, and the other of the first and second tuners corresponds to a sub picture, and
when a bit error rate of the digital signal obtained by demodulating the output signal from the one tuner corresponding to the main picture is smaller than a threshold, and a bit error rate of the digital signal obtained by demodulating the output signal from the other tuner corresponding to the sub picture is equal to or larger than the threshold, the signal processing portion increases or decreases the gain of the variable gain amplifier so as to reduce the value representing the degradation state of the digital signal obtained by demodulating the output signal from the other tuner corresponding to the sub picture.

5. A digital broadcasting receiver according to claim 4, wherein the signal processing portion judges one of the first and second tuners belonging to one of the main and sub pictures, and the other of the first and second tuners belonging to the other of the main and sub pictures in accordance with AGC signals from the first and second tuners.

* * * * *